US010428562B2

(12) United States Patent
Guibbert et al.

(10) Patent No.: US 10,428,562 B2
(45) Date of Patent: Oct. 1, 2019

(54) DEVICE FOR DETECTING A USER'S INTENTION TO LOCK OR UNLOCK A MOTOR VEHICLE DOOR

(71) Applicants: CONTINENTAL AUTOMOTIVE FRANCE, Toulouse (FR); CONTINENTAL AUTOMOTIVE GmbH, Hannover (DE)

(72) Inventors: Mickael Guibbert, Toulouse (FR); Gabriel Spick, Toulouse (FR); Pascal Perrot, Auzielle (FR)

(73) Assignees: CONTINENTAL AUTOMOTIVE FRANCE, Toulouse (FR); CONTINENTAL AUTOMOTIVE GMBH, Hannover (DE)

( * ) Notice: Subject to any disclaimer, the term of this patent is extended or adjusted under 35 U.S.C. 154(b) by 397 days.

(21) Appl. No.: 15/198,018

(22) Filed: Jun. 30, 2016

(65) Prior Publication Data
US 2017/0016255 A1    Jan. 19, 2017

(30) Foreign Application Priority Data
Jul. 8, 2015   (FR) ...................................... 15 56474

(51) Int. Cl.
*B60R 25/01* (2013.01)
*E05B 81/76* (2014.01)
(Continued)

(52) U.S. Cl.
CPC .............. *E05B 81/77* (2013.01); *B60R 25/01* (2013.01); *E05B 47/0002* (2013.01);
(Continued)

(58) Field of Classification Search
None
See application file for complete search history.

(56) References Cited

U.S. PATENT DOCUMENTS 7,654,147 B2    2/2010  Witte et al.
7,984,938 B2 *  7/2011  Tanimoto ................ E05B 81/78
                                              292/336.3
(Continued)

FOREIGN PATENT DOCUMENTS

CN        1856630       11/2006
CN      101233287        7/2008
(Continued)

OTHER PUBLICATIONS

FR Search Report, dated Mar. 29, 2016, from corresponding FR application.

*Primary Examiner* — Melissa J Koval
*Assistant Examiner* — Nasima Monsur
(74) *Attorney, Agent, or Firm* — Young & Thompson

(57) ABSTRACT

A device to be integrated into a handle of a vehicle door for detecting a user's intention to lock or unlock the door, with a casing therein that includes a contact detection element that detects a contact of a user's hand on the handle, where an area of contact of the handle is defined by an elastically deformable part, and the contact detection element includes a non-magnetic metal target that moves along a predetermined axis, a coil, a pre-stressed compressible element between the non-magnetic metal target and the coil, means for transmitting a movement of the elastic part to the non-magnetic metal target, and means for comparing a measured inductance of the coil and a predetermined threshold value of inductance for detecting the user's intention to lock or unlock the door.

17 Claims, 2 Drawing Sheets

(51) Int. Cl.
  *E05B 81/04* (2014.01)
  *E05B 81/88* (2014.01)
  *E05B 47/00* (2006.01)
  *G01D 5/20* (2006.01)
  *G01D 5/24* (2006.01)
  *H03K 17/95* (2006.01)
  *H03K 17/97* (2006.01)

(52) U.S. Cl.
  CPC .............. *E05B 81/04* (2013.01); *E05B 81/76* (2013.01); *E05B 81/88* (2013.01); *G01D 5/20* (2013.01); *G01D 5/24* (2013.01); *H03K 17/9537* (2013.01); *E05B 2047/0067* (2013.01); *E05B 2047/0072* (2013.01); *H03K 2017/9706* (2013.01)

(56) References Cited

U.S. PATENT DOCUMENTS

2002/0125994 A1* 9/2002 Sandau ................... E05B 81/78 340/5.62
2003/0029210 A1 2/2003 Budzynski et al.
2008/0067050 A1* 3/2008 Ieda ........................ E05B 81/76 200/512
2009/0133510 A1 5/2009 Witte et al.
2009/0319212 A1* 12/2009 Cech ................... B60R 21/0136 702/65
2011/0037578 A1 2/2011 Emmerling et al.
2012/0167642 A1* 7/2012 Savant .................... E05B 81/76 70/91
2014/0232523 A1 8/2014 Rantet et al.

FOREIGN PATENT DOCUMENTS

| | | |
|---|---|---|
| CN | 201092784 | 7/2008 |
| CN | 102015382 | 4/2011 |
| CN | 103842218 | 6/2014 |
| DE | 10 2005 055515 A1 | 2/2007 |
| EP | 1 763 048 A1 | 3/2007 |
| EP | 2 088 267 A2 | 8/2009 |
| WO | 01/40607 A1 | 6/2001 |
| WO | 2005-124806 | 12/2005 |

* cited by examiner

DEVICE FOR DETECTING A USER'S INTENTION TO LOCK OR UNLOCK A MOTOR VEHICLE DOOR

FIELD OF THE INVENTION

The invention relates to a device for detecting a user's presence and a vehicle door handle comprising said device.

BACKGROUND OF THE INVENTION

At the present time, vehicle door handles are equipped with devices for detecting a user's presence. The detection of a user's presence, combined with the recognition of a "hands-free" remote access control badge worn by the user, enables the openable body sections of the vehicle to be locked and unlocked remotely. Thus, when the user wearing the corresponding electronic badge identified by the vehicle wishes to unlock the vehicle, he approaches or touches the vehicle door handle and the openable body sections of the vehicle are then automatically unlocked. When the user approaches or presses on a precise location on the vehicle door handle, called the "unlocking area", the door (or alternatively all the openable body sections) is/are unlocked without any further action by the user. Conversely, when the user, still wearing the necessary badge and identified by the vehicle, wishes to lock his vehicle, he closes the door of his vehicle and approaches or momentarily presses another precise location on the handle, called the "locking area". By means of this gesture, the openable body sections of the vehicle are automatically locked.

These presence detection devices usually comprise two capacitive sensors, in the form of two electrodes connected electrically to a printed circuit and integrated into the door handle, each in a precise locking or unlocking area. Usually, one electrode is dedicated to each area; that is to say, one electrode is dedicated to the detection of the user's approach and/or the contact of his hand in the locking area, and one electrode is dedicated to the user's approach and/or the contact of his hand in the unlocking area.

The presence detection device further comprises a radio frequency antenna, usually of the LF (English abbreviation for "Low Frequency") type. The detection device is connected to the computer of the vehicle or ECU (English abbreviation for "Electronic Control Unit"), and sends it a presence detection signal. The vehicle's computer has previously identified the user as being authorized to access the vehicle; alternatively, it proceeds to perform this identification after receiving this presence detection signal. For this purpose, it sends an identification request via the radio frequency antenna to the badge (or the remote control) worn by the user. This badge responds by sending its identification code by RF (radio frequency) radiation to the vehicle computer. If the computer recognizes the identification code as the code that authorizes access to the vehicle, it triggers the locking/unlocking of the door (or of all the openable body sections). However, if the computer has not received an identification code, or if the received identification is erroneous, the locking or unlocking does not take place.

These vehicles are therefore equipped with door handles comprising a detection device which itself comprises a radio frequency antenna, usually operating at low frequency, and two electrodes connected to a microcontroller integrated into a printed circuit and supplied with a voltage.

Purely for explanatory purposes, the device considered here is a detection device D comprising two electrodes, one electrode being dedicated to the unlocking area while the other electrode is dedicated to the locking area, said two electrodes being connected to a printed circuit comprising a microcontroller and an LF antenna. A prior art detection device D is described with reference to FIG. 1.

FIG. 1 shows a door handle 10 of a motor vehicle (vehicle not shown) in which a device D for detecting a user's presence is located. Said door handle 10 comprises a first surface S1 oriented toward the door P and a second surface S2, opposed to the first surface S1 and therefore oriented toward the side opposite the vehicle, or more precisely toward the user (not shown). This detection device D comprises a first unlocking electrode E2, having one face located near the first outer surface S1, control means 60 and an LF antenna (not shown) having one face located near the second outer surface S2, a second, locking, electrode E1 having one face located near the second outer surface S2, and control means 60. The first and second electrodes E1, E2 are connected to the control means 60. These control means 60 measure the capacitance at the terminals of each first and second electrode E1, E2 in order to detect the presence (approach and/or contact) of a user in the detection areas, that is to say in a locking area Z1 or in an unlocking area Z2, and consist, for example, of a microcontroller 60 integrated into a printed circuit 80. The LF antenna (not shown), for its part, is connected to an on-board computer of the vehicle (not shown) of the "Body Controller Module" (BCM) type, which manages the identification requests sent by said LF antenna.

However, this prior art detection device D has serious drawbacks.

In fact, the detection of a user's approach by means of capacitive sensors (the first and second electrode, E1 and E2) is not robust, and generates false positives.

In particular, in some environmental conditions, when the ambient air is humid, or if salt is present on the roads, a capacitive coupling is created between the detection areas (the locking area Z1 and the unlocking area Z2) and the metal parts of the vehicle, preventing any detection of a user's presence by the capacitive sensors.

Moreover, raindrops or snowflakes on the door handle increase the value of the capacitance measured by the capacitive sensors, thus giving rise to false positives.

Finally, detection by capacitive sensors is incompatible with handles coated with metallic paint or having chromium-plated surfaces, since the presence of metal in the handle creates a coupling with the detection areas and disables the user's presence detection.

While false positives are undesirable for some vehicles, they are completely unacceptable for other vehicles.

This is the case with vehicles fitted with deploying handles, that is to say handles in which the detection of a user's presence causes the movement of a motorized handle, which is fully integrated into the door when at rest, and is deployed and projects from the door when activated. For this type of handle, the deployment or retraction of the handle at the incorrect time, due to a false positive of the capacitive sensors, may trap the user's hand.

This is also the case in vehicles having electrically assisted opening, for which the unlocking detection is accompanied by not only the unlocking, but also the opening, of the door. In this case, false positives cause the door to open at the incorrect time.

Finally, false positives are unacceptable for vehicles having the "Safe Lock" safety function, where the locking detection causes the vehicle to be locked not only from the outside but also from the inside (anti-theft device). In this case, false positives may cause the user to be trapped inside the vehicle.

To overcome these drawbacks, there is a known prior art method of replacing at least one of the capacitive sensors, for example the capacitive sensor dedicated to locking the vehicle, with a mechanical switch of the push button type; however, a button on a handle is unsatisfactory for users in terms of aesthetic appearance and ease of use. For example, the button is visible from the outside, and is not suitable for deploying handles, where discretion regarding the presence of the handle in the door is desired above all else.

Moreover, pressing a push button is less convenient for the user than the automatic detection of the approach of his hand toward a handle which requires no pressure.

SUMMARY OF THE INVENTION

The present invention enables these drawbacks to be overcome, and proposes a device for detecting the intention to lock and/or unlock a motor vehicle door handle which does not have the drawbacks of the prior art.

In particular, the detection device according to the invention can provide reliable and robust detection of the intention to unlock or lock the vehicle, while generating no false positives and having a discreet aesthetic appearance and ease of use providing the greatest comfort, safety and efficiency for the user.

The invention proposes a device for detecting a user's intention to lock or unlock a motor vehicle door, said device being integrated into a handle, and consisting of a casing comprising:
  an element for detecting the contact of a user's hand on the handle,
  a printed circuit,
  and a voltage source,
the device being remarkable in that the casing comprises a first part, elastically deformable along a predetermined axis, comprising an area of contact with the handle, and in that the contact detection element further comprises:
  a non-magnetic metal target adapted to move along the predetermined axis;
  a coil connected to a capacitance, forming with said capacitance an oscillating circuit having a natural resonance frequency,
  means for adjusting the frequency of the oscillating circuit to a predetermined frequency,
  a prestressed compressible element, located between the non-magnetic metal target and the coil,
  means for transmitting a movement of the first part of the casing to the non-magnetic metal target,
  means for measuring an inductance of the coil,
  means for comparison between the measured inductance and a predetermined threshold value of inductance, for detecting the user's intention to lock or unlock the door,
  and means for controlling the adjustment means, the measurement means and the comparison means.

Advantageously, the area of contact with the handle consists in a protuberance of the first part.

Usefully, the predetermined frequency is less than or equal to the resonance frequency of the coil.

The means for measuring an inductance of the coil may comprise means for measuring the oscillation frequency of the coil.

The means for adjusting the frequency of the oscillating circuit and the means for measuring the oscillation frequency may be included in an inductance to digital converter.

Preferably, the casing having a bottom and a cover comprising the first part, said casing also comprises a second part aligned with the first part along the predetermined axis located in the bottom, and comprising an area of pressure on the handle.

The pressure area may consist in a locally increased thickness of the bottom.

The invention also relates to a motor vehicle door handle, comprising:
  a device according to one of the characteristics listed above, and
  at least one elastically deformable area aligned along the predetermined axis with the contact area, and having dimensions greater than or equal to those of the contact area.

Finally, the invention can be applied to any motor vehicle comprising a device according to any of the characteristics listed above.

BRIEF DESCRIPTION OF THE DRAWINGS

Other characteristics and advantages of the invention will be apparent from a reading of the following description and from an examination of the appended drawings, in which.

DETAILED DESCRIPTION OF THE INVENTION

Figure 1:
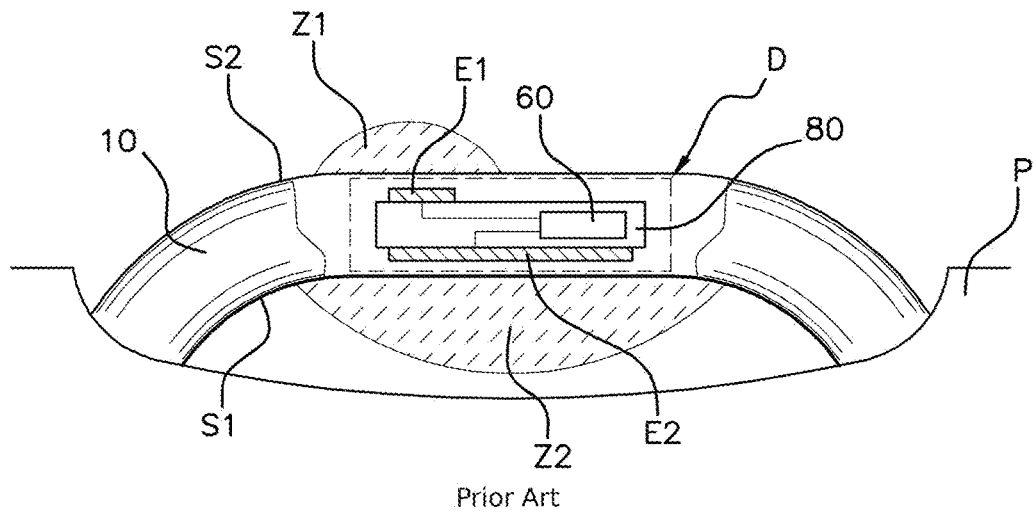
FIG. 1, explained above, shows schematically the detection device D according to the prior art.
Figure 2:
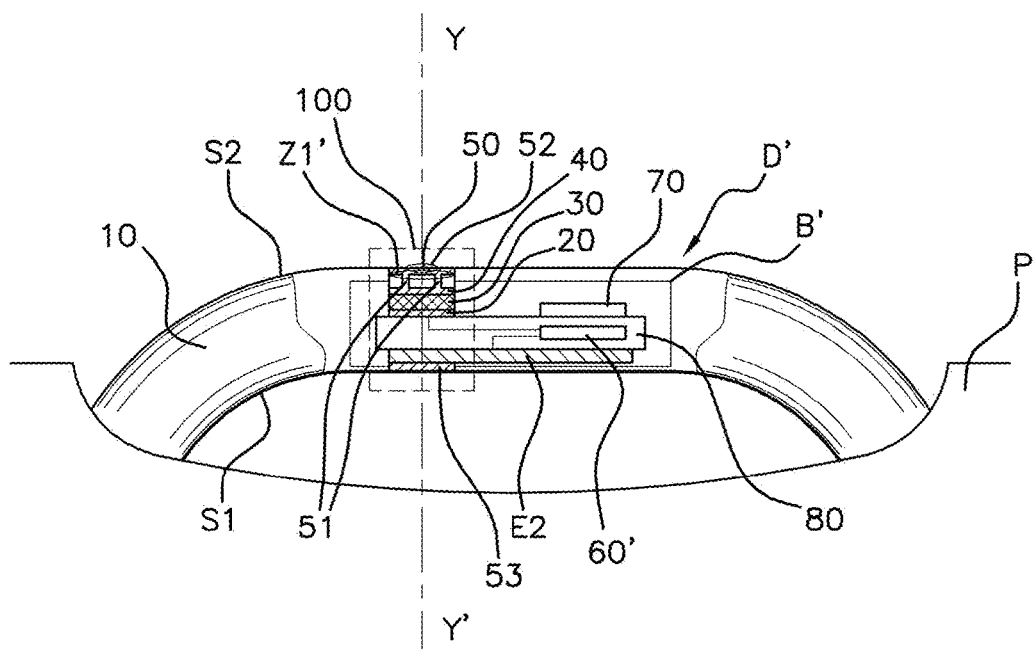
FIG. 2, shows schematically the detection device D' according to the invention.

The detection device D' according to the invention is illustrated in FIG. 2.

Said detection device D' takes the form of a casing integrated into the handle 10, and comprises, as in the prior art, a printed circuit 80 and at least one element for detecting the contact of the user's hand on the handle, and a voltage source.

However, by contrast with the prior art, in which the contact detection element was formed by a capacitive sensor (locking electrodes E1 or unlocking electrodes E2), the invention proposes that said contact detection element 100 comprise an inductive sensor, consisting of a non-magnetic metal target 40 and a coil 20 among other components.

More particularly, the casing B' comprises a first part 52, elastically deformable along a predetermined axis Y-Y', comprising an area 50 of contact with the handle 10, and the detection element 100 comprises:
  a non-magnetic metal target 40 adapted to move along the predetermined axis Y-Y';
  a coil 20, aligned along the axis Y-Y' with the non-magnetic metal target 40, connected to a capacitance C1 (see FIG. 4), forming with said capacitance C1 an oscillating LC circuit having a natural resonance frequency, means M1 (see FIG. 4) for adjusting the frequency of the oscillating circuit consisting of the coil 20 and the capacitance C1 to a predetermined frequency, a compressible prestressed element 30, located between the target 40 and the coil 20, means 51 for transmitting a movement of the first part 52 to the non-magnetic metal target 40, means M2 (see FIG. 4) for measuring an inductance of the coil 20, means M3 (see FIG. 4) for comparison between the measured inductance and a predetermined threshold value of inductance, for detecting the user's intention to lock or unlock the door, and means 60' for controlling the adjustment means M1, the measurement means M2 and the comparison means M3.

In this example, the detection element 100 is dedicated to the detection of the intention to lock, and replaces the prior art capacitive sensor for detecting locking, but the invention is applicable, mutatis mutandis, to the detection of the intention to unlock, as a replacement for the prior art capacitive sensor for detecting unlocking.

The first part 52 of the casing B' is elastically deformable along the axis Y-Y'. The casing B' being integrated into the handle 10, said first part 52 has one face located near the second outer surface S2 of the handle, and can be deformed when the user presses (see the arrow "A" in FIG. 3) on a locking area Z1' (see FIGS. 2 and 3) located on said second outer surface S2 of the handle 10. For this purpose, said first part B2 is aligned with the locking area Z1' along the axis Y-Y'.

Figure 3:
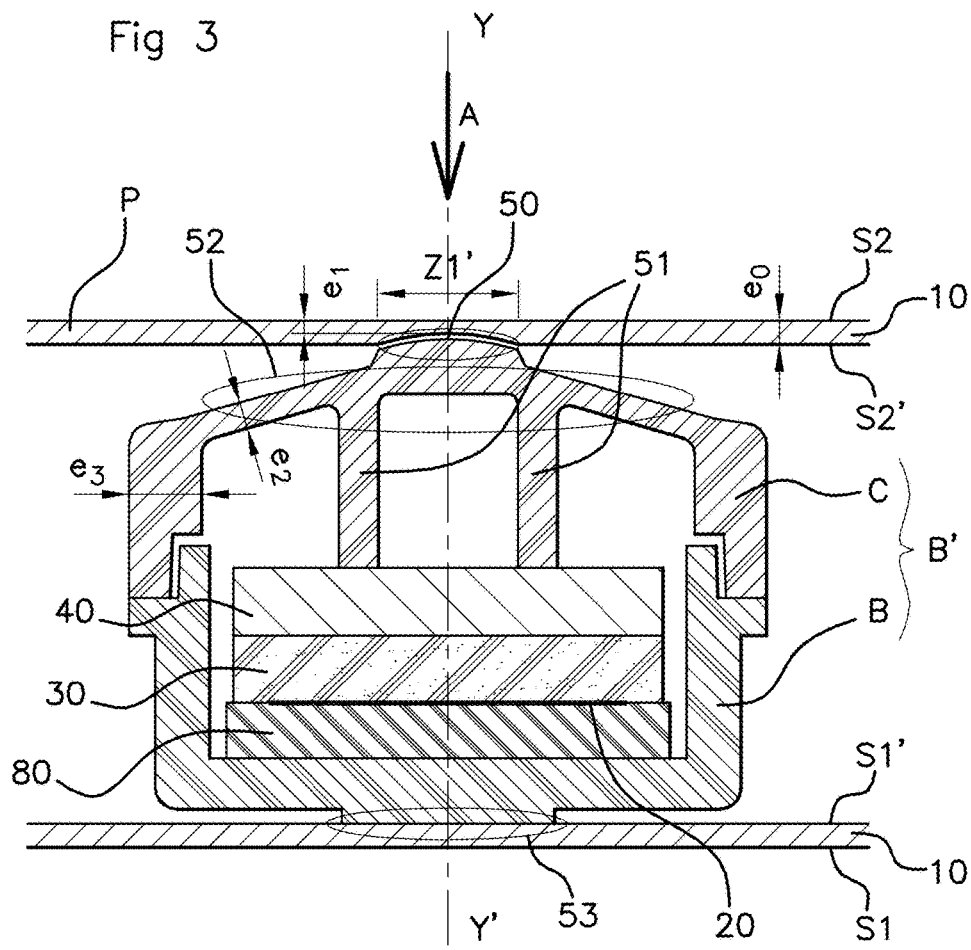
FIG. 3 shows schematically a sectional view taken along the axis Y-Y' of the detection device D' of FIG. 2 according to the invention.

The expression "elastically deformable" means that the first part 52 is:

made of an elastic material, for example Bayblend® T85MN, having a Young's modulus of 200 MPa at 25° C., having, for example, a thickness e2 which is less than the wall thickness e3 of the casing B' outside this first part 52 (see FIG. 3). For example, e2=1 mm and e3=2 mm.

The first part 52 comprises an area 50 of contact with the handle 10, which is aligned with the locking area Z1'. Preferably, the contact area 50 is circular in shape.

The dimensions of the contact area 50 in a plane P perpendicular to the axis Y-Y', and parallel to the second outer surface S2 of the handle 10 are defined, for example, on the basis of the dimensions of a finger of the user's hand.

Preferably, the dimensions of the contact area 50 are smaller than the dimensions of the locking area Z1'.

In the embodiment shown in FIG. 3, the casing B' is made in two parts, and comprises a cover C oriented toward the second surface S2 and a bottom B oriented toward the first surface S1. The cover C comprises a local protuberance (see FIG. 3), located at the top and in the middle according to the sectional view through Y-Y' of the cover C, which forms the area 50 of contact with the handle 10.

In a preferred embodiment of the invention, the handle 10 also comprises an elastically deformable area located facing the contact area 50 of the casing B'. Advisably, the elastically deformable area is the locking area Z1', and its dimensions are at least greater than the dimensions of the contact area 50.

The elastically deformable area of the handle 10 is made of a flexible material, for example the same material as the first part 52 (Bayblend®, for example), and its thickness e1 is less than the thickness e0 of the second outer surface S2 of the handle 10 located around said elastically deformable area.

The non-magnetic metal target 40 is adapted to move along the axis Y-Y'. Said non-magnetic metal target 40 is made, for example, of aluminum or any other non-magnetic metal. The non-magnetic metal target 40 may be cylindrical in shape.

The coil 20 consists of a winding of copper wire for example, etched on the printed circuit 80. Said coil 20 is electrically connected to a capacitance C1, thus forming an oscillating LC circuit, and is also connected to:

the means M1 for adjusting the frequency of the oscillating circuit consisting of the coil 20 and the capacitance C1, the means M2 for measuring the inductance of the coil 20, the means M3 for comparison between the measured inductance and a threshold value of inductance.

Figure 4:
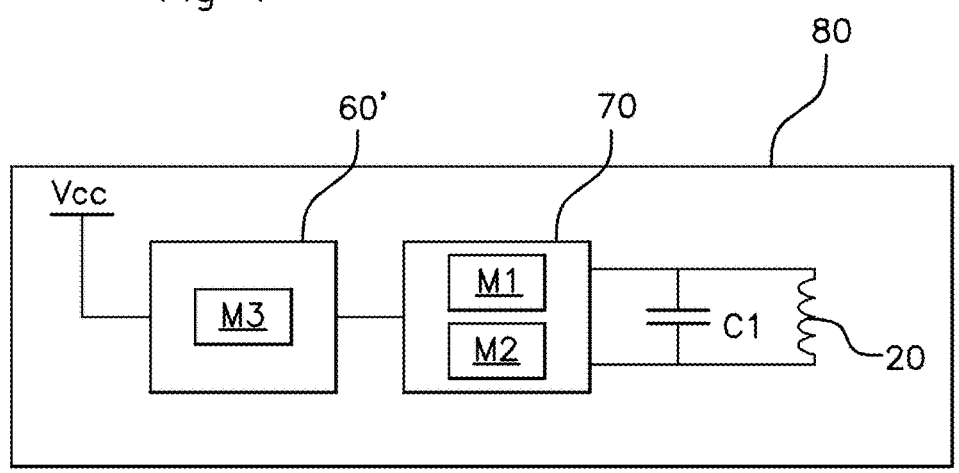
FIG. 4 shows schematically the adjustment means M1, the measurement means M2 and the comparison means M3 of the detection device D' according to the invention.

Preferably, the inductance measurement means M2 consist of means for measuring the oscillation frequency of the oscillating circuit consisting of the coil 20 and the capacitance C1, and are included, with the frequency adjustment means M1 (an oscillator, for example) in an inductance to digital converter 70 (see FIG. 4).

The comparison means M3 are provided in software form.

The control means 60' consist of a microcontroller 60', and the comparison means M3 are, for example, integrated into the microcontroller 60', supplied with a voltage Vcc.

The microcontroller 60', the inductance to digital converter 70, the coil 20 and the capacitance C1 are integrated into the printed circuit 80.

The compressible prestressed element 30 is located between the non-magnetic metal target 40 and the coil 20, and is made, for example, of EPDM (ethylene propylene diene monomer), or more precisely of a flexible closed-cell foam which is highly flexible and withstands temperatures in the range from −40° C. to +85° C.

The compressible prestressed element 30 undergoes two successive prestresses, namely a first prestress during its assembly into the casing B', then a second prestress during the assembly of the casing B' into the handle 10.

Being located between the non-magnetic metal target 40 and the coil 20, when the casing B' has been integrated into the handle 10, the thickness of said compressible prestressed element 30, when compressed, provides an initial distance d0 between the non-magnetic metal target 40 and the coil 20.

In a preferred embodiment, the casing B' also comprises, in its bottom B, a second part 53 which is an area of pressure on the handle 10, and is aligned with the first part 52 along the axis Y'Y'.

Said second part 53 takes the form, for example, of a local increased thickness of the bottom B of the casing B'.

The means 51 for transmitting a movement of the first part 52 to the non-magnetic metal target 40 take the form of two arms 51 extending the first part 52 along the axis Y-Y' toward the non-magnetic metal target 20. The transmission means 51 may also take the form of a hollow cylinder connecting the first part 52 to the non-magnetic metal target 20 along the axis Y-Y'.

When the user presses on the locking area Z1' (see arrow A in FIG. 3), that is to say on the deformable area of the handle 10, said deformable area and the first part 52 (also elastically deformable), which is in contact with the deformable area via the contact area 50, are deformed and cause the transmission means 51 to move along the axis Y-Y'. The transmission means 51 then press on the non-magnetic metal target 40 and transmit the movement to said non-magnetic metal target 40. Said non-magnetic metal target 40 moves in its turn, and compresses the compressible prestressed element 30. As it is compressed, the compressible prestressed element 30 approaches said non-magnetic metal target 40 of the coil 20. At the end of the pressing action, the final distance d1 between the non-magnetic metal target 40 and the coil 20 is less than the initial distance d0 before pressing.

It should be noted that said elastically deformable area located on the handle 10 thus enables the movement of the non-magnetic metal target 40 to be extended toward the coil 20, without affecting the overall rigidity of the handle 10.

For example, if there is a force of 10 N exerted by the user on the locking area Z1' of the handle 10, and an initial distance d0 of about 1 mm between the non-magnetic metal target 40 and the coil 20, the movement of the non-magnetic metal target 40 during pressing varies from about 20 μm to 100 μm, and the final distance d1 between the non-magnetic metal target 40 and the coil is then in the range from 0.9 mm to 0.98 mm.

This movement from the initial distance d0 to the final distance d1 modifies the inductance of the coil 20. The variation in the inductance of said coil 20 is therefore representative of the user's pressure on the handle 10.

The invention proposes to measure the variation in the inductance of the coil 20 in order to detect the user's pressure on the handle 10, and thus to validate his intention to unlock the vehicle.

For this purpose, the control means 60' initially control the oscillation frequency of the oscillating circuit, using the frequency adjustment means M1.

For example, the adjustment means M1 adjust the oscillation frequency of the oscillating circuit consisting of the coil 20 and the capacitance C1 to a level close to its resonance frequency, for example to a value of 80% of its resonance frequency.

When the user presses on the locking area Z1' of the handle 10, the non-magnetic metal target 40 approaches the coil 20, as explained above, thereby modifying the oscillation frequency of the LC oscillating circuit.

The measurement means M2 measure a number of oscillations of the oscillating circuit during predetermined time interval d, and deduce from this the actual oscillation frequency of the LC oscillating circuit consisting of the coil 20 and the capacitance C1. By measuring the actual frequency of said oscillating circuit, the measurement means M2 deduce from this the inductance L of the coil 20.

$$F = \frac{1}{2 \times \pi \times \sqrt{L \times C}}$$

And therefore:

$$L = \frac{1}{C} \times \left(\frac{1}{2 \times \pi \times F}\right)^2$$

The comparison means M3 compare the inductance L measured in this way with a threshold inductance value $L_s$ representative of the user's pressure on the handle 10. If the measured inductance is below the threshold inductance value, that is to say L<Ls, then the user is pressing on the handle 10, and his intention of locking the vehicle is validated.

It should be noted that other measurement strategies are possible; an equivalent resistance of the oscillating circuit may be measured and compared with a threshold value of equivalent resistance. In this case, if the measured value of the equivalent resistance is greater than the threshold value of equivalent resistance, then the user is pressing on the handle 10, and his intention of locking the vehicle is validated.

Thus the detection device D' according to the invention can be used to detect the intention to lock the vehicle, in a reliable manner and without the risk of false positives. This is because the inductive sensor, unlike the prior art capacitive sensor, is not sensitive to external disturbances.

Moreover, the compressible prestressed element, the first part of the casing (which is elastically deformable), and the elastically deformable part of the handle enable the movement of the non-magnetic metal target relative to the coil to be extended without adversely affecting the aesthetic appearance or the ease of use of the handle.

Advisably, the detection device D' of the invention is designed to measure movements of the target which are very small (20 μm to 100 μm), but which are representative of the user's pressure on the locking area for locking his vehicle.

The invention claimed is:

1. A device (D') to be integrated into a motor vehicle door handle for detecting a user's intention to lock or unlock a motor vehicle door, comprising:
   a casing (B'), that includes
      a contact detection element (100) that detects a contact of a user's hand on the door handle (10),
      a printed circuit (80) in electrical communication with the contact detection element,
      and a voltage source (Vcc) connecting to the printed circuit to energize the printed circuit, and
      an elastically deformable first part (52), which is elastically deformable along a predetermined axis (Y-Y'), the first part presenting an area (50) of contact with an interior surface of the door handle (10),
   wherein the contact detection element (100) includes
      a non-magnetic metal target (40), beneath the elastically deformable first part and adapted to move along the predetermined axis (Y-Y') responsive to a deformation of said elastically deformable first part,
      a coil (20), connected to a capacitance (C1), forming with said capacitance (C1) an oscillating circuit having a natural resonance frequency,
      means (M1), provided on the printed circuit, for adjusting the frequency of the oscillating circuit to a predetermined frequency,
      a prestressed compressible element (30), located between the non-magnetic metal target (40) and the coil (20),
      means (51) for transmitting a movement of the first part (52) of the casing (B') to the non-magnetic metal target (40),
      means (M2), provided on the printed circuit, for measuring an inductance (L) of the coil (20),
      means (M3), provided on the printed circuit, for comparison between the measured inductance (L) and a predetermined threshold value of inductance (Ls), for detecting the user's intention to lock or unlock the door, and
      means (60'), provided on the printed circuit, for controlling the adjustment means (M1), the measurement means (M2) and the comparison means (M3).

2. The device as claimed in claim 1, wherein the area (50) of contact with the door handle (10) is constituted by a protuberance of the first part (52).

3. The device as claimed in claim 1, wherein the predetermined frequency is less than or equal to the resonance frequency of the coil (20).

4. The device as claimed in claim 1, wherein the means (M2) for measuring an inductance (L) of the coil (20) comprise means for measuring the oscillation frequency of the coil (20).

5. The device as claimed in claim 4, wherein the means (M1) for adjusting the frequency of the oscillating circuit and the means (M2) for measuring the oscillation frequency are included in an inductance to digital converter (70) on the printed circuit.

6. The device as claimed in claim 1,
wherein the casing (B') has a bottom (B), and a cover (C) positioned over the bottom (B) and formed by the elastically deformable first part (52), and
wherein said casing (B') includes a second part (53), aligned with the first part (52) along the predetermined axis (Y-Y') and located in the bottom (B), and includes an area of pressure on the door handle (10).

7. The device as claimed in claim 6, wherein the pressure area is constituted by a local increased thickness of a surface of the bottom (B).

8. A motor vehicle door handle (10), comprising:
a device (D') as claimed in claim 1, positioned in an interior of the door handle (10); and
at least one elastically deformable area (Z1') aligned along the predetermined axis (Y-Y') with the contact area (50), and having dimensions greater than or equal to those of the contact area (50).

9. A motor vehicle comprising a device (D') as claimed in claim 1.

10. The device as claimed in claim 2, wherein the predetermined frequency is less than or equal to the resonance frequency of the coil (20).

11. The device as claimed in claim 2, wherein the means (M2) for measuring an inductance (L) of the coil (20) comprise means for measuring the oscillation frequency of the coil (20).

12. The device as claimed in claim 3, wherein the means (M2) for measuring an inductance (L) of the coil (20) comprise means for measuring the oscillation frequency of the coil (20).

13. The device as claimed in claim 2,
wherein the casing (B') has a bottom (B), and a cover (C) that comprises the elastically deformable first part (52), and
wherein said casing (B') includes a second part (53), aligned with the first part (52) along the predetermined axis (Y-Y') and located in the bottom (B), and includes an area of pressure on the door handle (10).

14. A device (D') for a motor vehicle door handle for detecting a user's intention to lock or unlock a motor vehicle door, comprising:
a casing (B'), configured to be fitted in an interior of the door handle, the casing having a cover element and a bottom element beneath the cover element; and
a contact detection element (100) provided inside said casing,
wherein the cover element comprises an elastically deformable first part that is elastically deformable along a predetermined axis (Y-Y'), the first part including an area (50) that contacts an interior surface of the door handle (10),
wherein the contact detection element (100) includes
a non-magnetic metal target (40), beneath the elastically deformable first part and adapted to move along the predetermined axis (Y-Y') responsive to a deformation of said elastically deformable first part,
a coil (20), beneath the non-magnetic metal target, and connected to a capacitance (C1) so as to form with said capacitance (C1) an oscillating circuit having a natural resonance frequency,
a prestressed compressible element (30), located between the non-magnetic metal target (40) and the coil (20),
means (M1) for adjusting the frequency of the oscillating circuit to a predetermined frequency, means (51) for transmitting a movement of the first part (52) of the casing (B') to the nonmagnetic metal target (40),
means (M2) for measuring an inductance (L) of the coil (20),
means (M3) for comparison between the measured inductance (L) and a predetermined threshold value of inductance (Ls), for detecting the user's intention to lock or unlock the door, and
means (60') for controlling the adjustment means (M1), the measurement means (M2) and the comparison means (M3).

15. The device as claimed in claim 14, wherein the bottom element of the casing includes a second part (53), aligned with the first part (52) along the predetermined axis (Y-Y'), the second part constituted by a local increased thickness of a surface of the bottom element that contacts an other interior surface of the door handle (10).

16. A door handle (10) for a door of a motor vehicle, comprising:
a top portion and a bottom portion, enclosing an interior space; and
a user detection device that detects a user's intention to lock or unlock the door of the motor vehicle, positioned beneath a surface of the top portion and above a surface of the bottom portion,
wherein the user detection device includes
a casing (B') inside the interior of the door handle, the casing having a cover element and a bottom element beneath the cover element, and
a contact detection element (100) provided inside said casing,
the cover element including an elastically deformable first part that is elastically deformable along a predetermined axis (Y-Y'), the first part including an area (50) that contacts an interior surface of the top portion of the door handle (10),
and wherein the contact detection element (100) includes
a non-magnetic metal target (40), beneath the elastically deformable first part and adapted to move along the predetermined axis (Y-Y') responsive to a deformation of said elastically deformable first part,
a coil (20), beneath the non-magnetic metal target, and connected to a capacitance (C1) so as to form with said capacitance (C1) an oscillating circuit having a natural resonance frequency,
a prestressed compressible element (30), located between the non-magnetic metal target (40) and the coil (20),
means (M1) for adjusting the frequency of the oscillating circuit to a predetermined frequency, means (51) for transmitting a movement of the first part (52) of the casing (B') to the nonmagnetic metal target (40),
means (M2) for measuring an inductance (L) of the coil (20),
means (M3) for comparison between the measured inductance (L) and a predetermined threshold value of inductance (Ls), for detecting the user's intention to lock or unlock the door, and means (60') for controlling the adjustment means (M1), the measurement means (M2) and the comparison means (M3).

17. The door handle as claimed in claim 16, wherein the bottom element of the casing includes a second part (53), aligned with the first part (52) along the predetermined axis (Y-Y'), the second part constituted by a local increased thickness of a surface of the bottom element that contacts an interior surface of the bottom portion of the door handle (10).

* * * * *